United States Patent [19]
Birdsall et al.

[11] Patent Number: 5,378,938
[45] Date of Patent: Jan. 3, 1995

[54] SAMPLE-AND-HOLD CIRCUIT INCLUDING PUSH-PULL TRANSCONDUCTANCE AMPLIFIER AND CURRENT MIRRORS FOR PARALLEL FEED-FORWARD SLEW ENHANCEMENT AND ERROR CORRECTION

[75] Inventors: Dwight D. Birdsall, Norwalk; Lloyd F. Linder, Agora Hills, both of Calif.; Phillip L. Elliott, Fort Collins, Colo.

[73] Assignee: Hughes Aircraft Company, Los Angeles, Calif.

[21] Appl. No.: 18,856

[22] Filed: Feb. 5, 1993

[51] Int. Cl.$^6$ .................. H03K 5/159; H03K 17/687
[52] U.S. Cl. ....................... 327/94; 327/91; 327/379
[58] Field of Search ............... 307/352–353, 307/572; 328/151

[56] References Cited
U.S. PATENT DOCUMENTS

| | | | |
|---|---|---|---|
| 4,502,020 | 2/1985 | Nelson et al. | 330/265 |
| 4,659,945 | 4/1987 | Metz | 307/353 |
| 4,780,689 | 10/1988 | Saller et al. | 330/267 |
| 4,783,602 | 11/1988 | Viswanathan | 307/353 |
| 4,970,470 | 11/1990 | Gosser | 330/252 |
| 5,124,576 | 6/1992 | Jensen | 307/353 |

OTHER PUBLICATIONS

"A 1.2-μm BiCMOS Sample-and-Hold Circuit with a Constant-Impedance, Slew Enhanced Sampling Gate:," M. Wakayama et al., in IEEE Journal of Solid State Circuits, vol. 27, No. 12, Dec. 1992, pp. 1697–1708.

*Primary Examiner*—Margaret Rose Wambach
*Attorney, Agent, or Firm*—Georgann S. Grunebach; Terje Gudmestad; W. K. Denson-Low

[57] ABSTRACT

A transconductance push-pull amplifier (20) generates primary push-pull currents (I1, I2) corresponding to a voltage input signal (VIN). Current mirrors (42,44) generate secondary push-pull currents (I3, I4) corresponding to the primary push-pull currents (I1, I2). For sampling, both the primary and secondary push-pull currents (I1, I2, I3, I4) are applied to charge a capacitor (C3) in a current feed-forward arrangement with high slew rate and fast signal acquisition to produce a voltage output signal (VOUT). The capacitor (C3) is disconnected from the amplifier (20) and current mirrors (42,44) to hold the output signal (VOUT). Switching transistors (Q13, Q15) which are connected between the capacitor (C3) and the current mirrors (42,44) have substantially the same non-linear modulation characteristics as corresponding output transistors (Q7, Q8) in the amplifier (20). The output and switching transistors (Q7, Q8, Q13, Q15) are connected to modulate out-of-phase such that non-linear modulation of the primary push-pull currents (I1, I2) by the output transistors (Q7, Q8) is canceled by non-linear modulation of the secondary push-pull currents (I3, I4) by the switching transistors (Q13, Q15), and the output signal (VOUT) is a highly linear replica of the input signal (VIN).

22 Claims, 3 Drawing Sheets

SAMPLE-AND-HOLD CIRCUIT INCLUDING PUSH-PULL TRANSCONDUCTANCE AMPLIFIER AND CURRENT MIRRORS FOR PARALLEL FEED-FORWARD SLEW ENHANCEMENT AND ERROR CORRECTION

This invention was made with Government support. The Government has certain rights in this invention.

BACKGROUND OF THE INVENTION

1. Field of the Invention

The present invention generally relates to the art of electronic waveform sampling circuits, and more specifically to a sample-and-hold circuit including a push-pull transconductance current amplifier and current mirrors for high slew current, fast signal acquisition and high linearity.

2. Description of the Related Art

Sample-and-hold circuits charge a holding element, which is usually a capacitor, to the instantaneous amplitude of an analog input signal during a tracking or sampling interval, and then disconnect the input signal from the capacitor during a holding interval. The sampled voltage which is held by the capacitor is typically applied to an analog-to-digital converter which produces a corresponding digital value which is stored in a random access memory of a waveform processing unit. A set of stored digital values obtained at increments of a sampled waveform constitutes a digital approximation of the analog signal, and can be analyzed or processed using a variety of known algorithms in accordance with a particular application.

A typical prior art sample-and-hold circuit is described in U.S. Pat. No. 4,659,945, entitled "SAMPLING BRIDGE", issued Apr. 21, 1987 to A Metz. The circuit includes diodes which are connected in a bridge configuration and alternatingly switched between forward and reverse bias to couple an input signal to a capacitor for sampling, and to disconnect the input signal from the capacitor for holding.

The basic diode bridge sample-and-hold circuit does not provide input buffering, and the preceding stage is required to supply the dynamic slew current in the sampling mode. In addition, the sampled pedestal as well as the D.C. offset are determined by the matching of the diode pairs.

The effect of the diode mismatch can be reduced by decreasing the D.C. bias current through the diodes in sampling mode. This, however, reduces the maximum dynamic slew current which is available for charging and discharging the capacitor, thereby limiting the slew rate and increasing the signal acquisition time during the transition from holding to sampling mode.

As another drawback, the maximum dynamic slew current in the basic diode bridge is limited to one-half of the D.C. standing or bias current flowing through the circuit. This also limits the slew rate and increases the acquisition time.

An improved sample-and-hold circuit which uses diodes as switching elements is disclosed in article entitled "A 1.2-μm Bicmos Sample-and-Hold Circuit with a Constant-Impedance Slew-Enhanced Sampling Gate", by M. Wakayama et al, in IEEE Journal of Solid-State Circuits, Vol. 27, No. 12, Dec. 1992, pp. 1697–1708. This circuit is illustrated in FIG. 1 and designated as 10.

The circuit 10 includes diodes D1 to D4 which are connected in an arrangement which resembles, but does not function as a bridge. A voltage input signal VIN is applied to the bases of NPN bipolar transistors Q1 and Q2. The emitters of the transistors Q1 and Q2 are connected to the collectors of similar transistors Q3 and Q4 respectively, the emitters of which are connected to a constant current source IS1 which sinks a constant current IBIAS.

The emitter of the transistor Q1 is also connected to the cathode of the diode D1 and the anode of the diode D3. The emitter of the transistor Q2 is connected to the anode of the diode D2 and the cathode of the diode D4. The junction of the diodes D1 and D2 is connected across a capacitor C1 which produces an output voltage VOUT1. The junction of the diodes D3 and D4 is connected across a capacitor C2 which produces an output voltage VOUT2.

The collectors of the transistors Q1 and Q2 are connected to the input of a current mirror 12 to produce a reference current IREF. The current mirror 12 generates output currents IOUT1 and IOUT2 which are each equal to IREF and are applied to the emitters of the transistors Q1 and Q2 respectively.

The circuit 10 is periodically switched such that the capacitor C1 is charged or discharged to sample the input signal VIN while the capacitor C2 is disconnected to hold the input signal VIN as previously sampled, and vice-versa.

When a TRACK1/HOLD2 switching signal applied to the base of the transistor Q3 is high and a TRACK2-/HOLD1 switching signal applied to the base of the transistor Q4 is low, the capacitor C1 operates in sampling mode and the capacitor C2 operates in holding mode. The transistors Q1 and Q3 are turned on and the transistors Q2 and Q4 are turned OFF. The diodes D1 and D2 are forward biased and the diodes D3 and D4 are reverse biased. The capacitor C2 is effectively disconnected from the rest of the circuit 10 and holds the voltage to which it was charged when it was previously operated in sampling mode.

Under static conditions, the mirror currents IREF, IOUT1 and IOUT2 are each equal to IBIAS/3 and flow through the transistor Q1 into the source IS1. The path for the current OUT2 is through the diodes D2 and D1. The signal VIN is coupled to the capacitor C1 through the transistor Q1 and the diode D1. The voltage VIN is reduced by one forward-biased diode drop Vbe across the base-emitter junction of the transistor Q1, and increased by one diode drop Vbe across the diode D1. The voltage VOUT1 is therefore substantially equal to the voltage VIN.

An increase in the input signal VIN causes the voltage at the emitter of the transistor Q1 to temporarily increase above VOUT1, and reverse bias the diode D1. The collector current of the transistor Q1, which constitutes the input current IREF of the current mirror 12, increases, thereby causing the output currents IOUT1 and IOUT2 to increase. The increased output current IOUT2 charges the capacitor C1 until VOUT1 becomes equal to VIN.

When the input signal VIN decreases, the diode D1 becomes forward biased and the capacitor C1 discharges through the diode D1 and the transistor Q3 into the source IS1 until VOUT1 becomes equal to VIN.

When the TRACK1/HOLD2 switching signal applied to the base of the transistor Q3 is low and the TRACK2/HOLD1 switching signal applied to the base of the transistor Q4 is high, the capacitor C1 operates in holding mode and the capacitor C2 operates in sampling mode. The operation is essentially similar to that described above, except that the transistors Q2 and Q4 and diodes D3 and D4 are operative rather than the transistors Q1 and Q3 and diodes D3 and D4.

The circuit 10 improves over the basic diode bridge circuit disclosed in the Metz patent in that the transistors Q1 and Q2 provide input buffering, and the current mirror increases the dynamic slew current by a factor of two. However, the circuit 10 suffers from the same limitation of the basic bridge circuit in that the maximum slew current is limited to the bias current provided by the source IS1.

Assuming that the capacitor C1 is operating in sampling mode and the capacitor C2 is operating in holding mode, the maximum current available for charging or discharging the capacitor C1 is equal to IBIAS. Since the reference current IREF of the current mirror 12 must be supplied by the current source IS1, its maximum value is limited to IBIAS. Since IOUT2 is equal to IREF, the maximum current available for charging the capacitor C1 is also equal to IBIAS.

For a value of VIN which is low enough to turn off the transistor Q1, the capacitor C1 discharges through the diode D1 and transistor Q3 into the source IS1. Since the maximum current the source IS1 can sink is IBIAS, the maximum discharge current is equal to IBIAS.

In summary, the maximum dynamic slew current which is available in the circuit 10 in sampling mode is limited to the standing or bias current IBIAS. This limits the slew rate and signal acquisition rate of the circuit to relatively low values. The circuit 10 also suffers from the drawback of the basic bridge circuit in that, due to the mismatch between the diodes D1 to D4, any attempt to increase the slew rate by increasing the bias current will cause a corresponding detrimental increase in the sampled pedestal and D.C. offset.

SUMMARY OF THE INVENTION

In accordance with the present invention, a transconductance push-pull amplifier generates primary push-pull currents corresponding to a voltage input signal. Current mirrors generate secondary push-pull currents corresponding to the primary push-pull currents.

For sampling, both the primary and secondary push-pull currents are applied in a parallel feed-forward arrangement to charge a capacitor with high slew rate and fast signal acquisition to produce a voltage output signal. The capacitor is disconnected from the amplifier and current mirrors to hold the output signal.

The parallel feed-forward operation of the current mirrors greatly increases the dynamic slew current which is available to charge and discharge the capacitor during sampling mode operation over the prior art. More specifically, the dynamic slew current is not limited to the standing or bias current. The increased dynamic slew current provides a corresponding increase in slew rate, and thereby the speed at which the input signal can be acquired during the transition from holding to sampling mode.

Switching transistors which are connected between the capacitor and the current mirrors have substantially the same non-linear modulation characteristics as corresponding output transistors in the amplifier. The output and switching transistors are connected to modulate out-of-phase such that non-linear modulation of the primary push-pull currents by the output transistors is canceled by non-linear modulation of the secondary push-pull currents by the switching transistors.

The cancellation of the non-linear signal modulation in combination with the parallel current feed-forward operation provide the present sample-and-hold circuit with substantially increased linearity over the prior art.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 2:
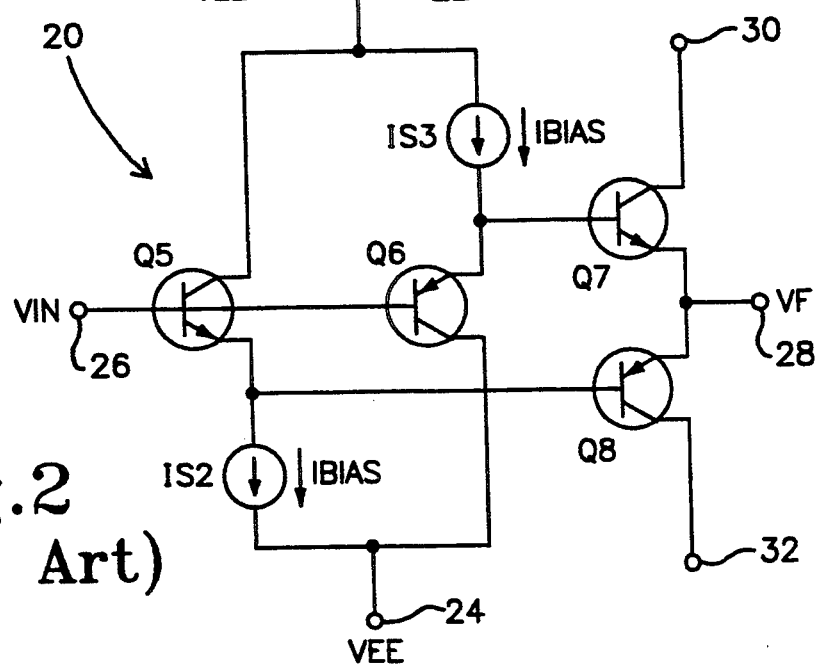
FIG. 2 similarly illustrates a prior art push-pull transconductance amplifier which constitutes an element of the present invention.

As illustrated in FIG. 2, a class AB push-pull transconductance amplifier or "A/B cell" which constitutes an input stage or front end of a sample-and-hold circuit embodying the present invention is generally designated as 20. The amplifier 20 is known in the art per se and is disclosed in U.S. Pat. No. 4,780,689, entitled "AMPLIFIER INPUT CIRCUIT", issued Oct. 25, 1988 to K Saller et al.

The amplifier 20 comprises an NPN bipolar transistor Q5 having a collector connected to a positive D.C. voltage source VCC through a terminal 22, and an emitter connected through a constant bias current source IS2 and a terminal 24 to a negative D.C. voltage source VEE. A PNP bipolar transistor Q6 has a collector connected to the power supply terminal 24 and an emitter connected through a constant bias current source IS3 to the terminal 22. An input voltage VIN is applied through a high impedance voltage input terminal 26 to the bases of the transistors Q5 and Q6.

An NPN output transistor Q7 has a base connected to the emitter of the transistor Q6 and an emitter connected to the emitter of a PNP output transistor Q8. The base of the transistor Q8 is connected to the emitter of the transistor Q5. The emitters of the transistors Q7 and Q8 are connected to a low impedance push-pull current output terminal 28. The collectors of the transistors Q7 and Q8 are connected to push-pull current output terminals 30 and 32 respectively.

The current sources IS2 and IS3 cause constant bias currents IBIAS to flow therethrough which set up suitable quiescent bias currents in the transistors Q5, Q6, Q7 and Q8. As the input signal VIN changes, the voltages at the emitters of the transistors Q5, Q6, Q7 and Q8 follow. More specifically, the voltages at the emitters of the transistors Q5 and Q6 are one diode drop Vbe below and above VIN respectively, and a voltage VF at the terminal 28 is substantially equal to VIN.

Figure 3:
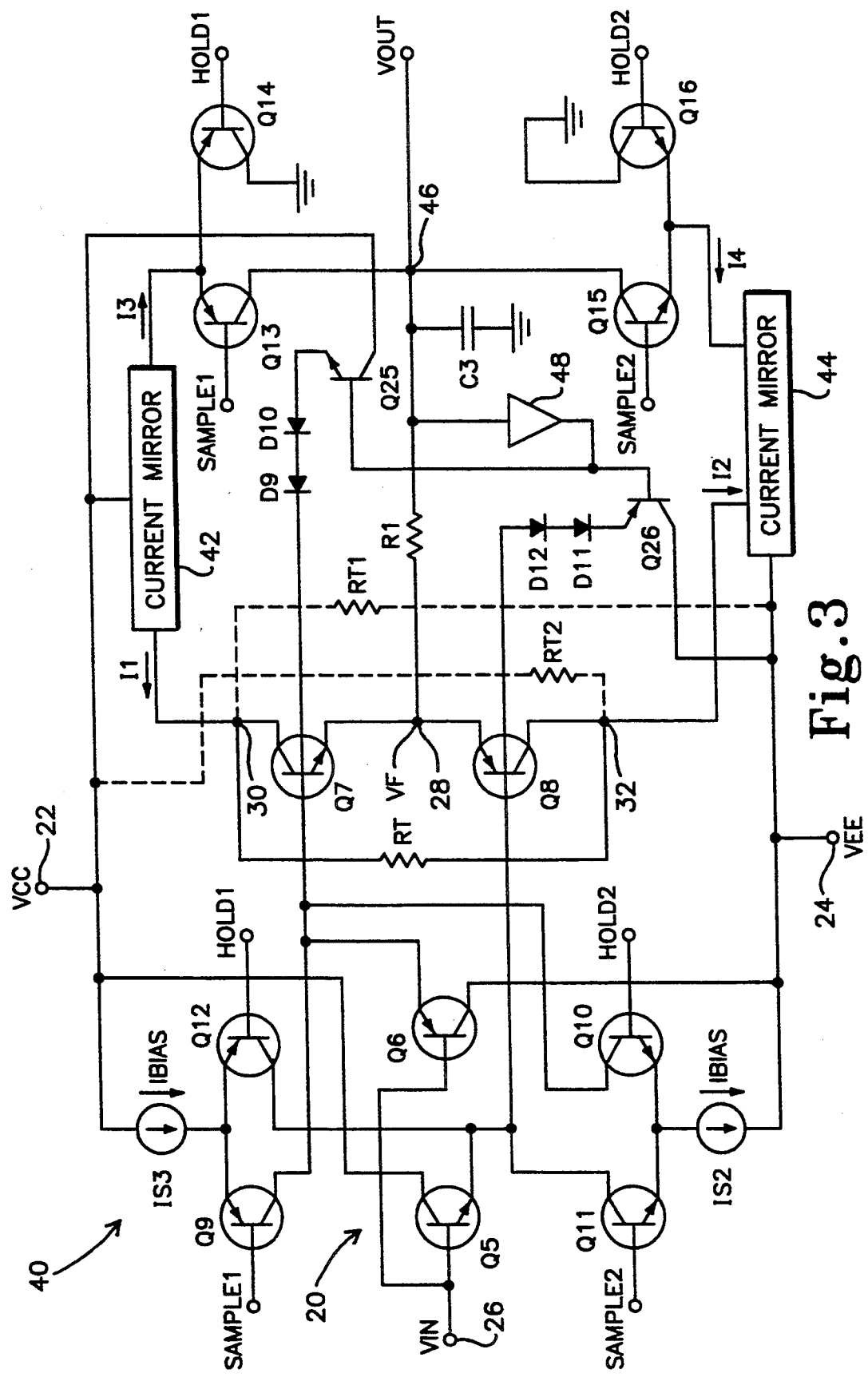
FIG. 3 illustrates a sample-and-hold circuit embodying the present invention.

The amplifier 20 per se is conventionally used as the front end in a current feedback amplifier such as disclosed in U.S. Pat. No. 4,502,020, entitled "SETTLING TIME REDUCTION IN WIDE-BAND DIRECT-COUPLED TRANSISTOR AMPLIFIERS", issued Feb. 26, 1985 to D Nelson et al An improved current feedback amplifier which provides reduced distortion through the use of a current mirror is disclosed in U.S. Pat. No. 4,970,470, entitled "DC-COUPLED TRANSIMPEDANCE AMPLIFIER", issued Nov. 13, 1990 to R Gosser In accordance with the present invention, transistor switches are added to the amplifier 20 such that it constitutes an element of a sample-and-hold circuit 40 as illustrated in FIG. 3. A PNP bipolar switching transistor Q9 has a base connected to receive a switching signal SAMPLE1, an emitter connected to the source IS3 and a collector connected to the emitter of the transistor Q6, the base of the transistor Q7 and the collector of an NPN transistor Q10. The base of the transistor Q10 is connected to receive a switching signal HOLD2, whereas the emitter of the transistor Q10 is connected to the source IS2.

An NPN switching transistor Q11 has a base connected to receive a switching signal SAMPLE2, an emitter connected to the source IS2 and a collector connected to the emitter of the transistor Q5, the base of the transistor Q8 and the collector of a PNP transistor Q12. The base of the transistor Q12 is connected to receive a switching signal HOLD1, whereas the emitter of the transistor Q12 is connected to the source IS3.

The push-pull current output terminals 30 and 32 of the amplifier 20 are connected to inputs of current mirrors 42 and 44 respectively. Primary push-pull currents I1 and I2 flow from the voltage sources VCC and VEE through the current mirrors 42 and 44 and transistors Q7 and Q8 respectively to the current output terminal 28.

The outputs of the current mirrors 42 and 44 generate secondary push-pull currents I3 and I4 which correspond to the primary push-pull currents I1 and I2 respectively. In the preferred embodiment of the invention, the current mirrors 42 and 44 have unity current gain, and the currents I3 and I4 are equal to the currents I1 and I2 respectively. However, it is within the scope of the invention to make the current gain of the current mirrors 42 and 44 greater than unity to provide current amplification, or smaller than unity if desired.

A PNP switching transistor Q13 has a base connected to receive the signal SAMPLE1, an emitter connected to receive the current I3 from the current mirror 42 and a collector connected to a high impedance output node 46. The base of a PNP switching transistor Q14 is connected to receive the signal HOLD1, whereas the emitter of the transistor Q14 is connected to the emitter of the transistor Q13 and the collector of the transistor Q14 is connected to ground.

An NPN switching transistor Q15 has a base connected to receive the signal SAMPLE2, an emitter connected to receive the current I4 from the current mirror 44 and a collector connected to the output node 46. The base of an NPN switching transistor Q16 is connected to receive the signal HOLD2, whereas the emitter of the transistor Q16 is connected to the emitter of the transistor Q15 and the collector of the transistor Q16 is connected to ground.

A sample-and-hold capacitor C3 is connected across the output node 46, more specifically between the node 46 and ground. A resistor R1 is connected between the current output terminal 28 of the amplifier 20 and the output node 46.

The base of an NPN transistor Q25 is connected to the output of a bootstrap buffer amplifier 48, the input of which is connected to the node 46. The collector of the transistor Q25 is connected to the source VCC, and the emitter thereof is connected through diodes D9 and D10 to the base of the transistor Q7.

The base of a PNP transistor Q26 is connected to the output of the amplifier 48, with the collector thereof being connected to the source VEE. The emitter of the transistor Q25 is connected through diodes D11 and D12 to the base of the transistor Q8.

The circuit 40 is operated in sampling mode by making the signal SAMPLE1 low, SAMPLE2 high, HOLD1 high and HOLD2 low. This turns on the transistors Q9 and Q11 to operatively connect the transistors Q6 and Q5 to the constant current sources IS3 and IS2, and enable or activate the amplifier 20 to generate and apply the primary push-pull currents I1 and I2 to the current mirrors 42 and 44 respectively. The transistors Q10 and Q12 are turned off. The transistors Q13 and Q15 are turned on to enable the current mirrors 42 and 44 to apply the secondary push-pull currents I3 and I4 respectively to the output node 46. The transistors Q14 and Q16 are turned off.

Under static conditions, an output voltage VOUT which is developed across the capacitor C3 and appears at the output node 46 is equal to the input voltage VIN due to the emitter-follower configuration of the transistors Q5, Q6, Q7 and Q8. If the input voltage VIN at the input terminal 26 increases above the voltage VF at the current output terminal 28, primary push-pull current will flow out of the terminal 28 through the resistor R1 to the node 46 to charge the capacitor C3, with the current I1 through the terminal 30 increasing and the current I2 through the terminal 32 decreasing.

The primary push-pull currents I1 and I2 are mirrored by the current mirrors 42 and 44 to the output node 46 as the secondary push-pull currents I3 and I4 respectively due to the parallel feed-forward operation of the current mirrors 42 and 44, and cause current to flow into or out of the node 46 to further charge the capacitor C3. The voltage across the capacitor C3 increases and causes the output voltage VOUT to increase until the voltage VF at the current output terminal 28 increases to the new value of VIN. The operation is opposite for a decrease in the input voltage VIN.

For holding mode operation, the logical senses of the switching signals SAMPLE1, SAMPLE2, HOLD1 AND HOLD2 are reversed, and the transistors Q5, Q6, Q7, QS, Q9, Q11, Q13 and Q15 are turned off to disable or de-activate the amplifier 20, and disconnect the capacitor C3 from the rest of the circuit 40. The voltage across the capacitor C3 and thereby the output voltage VOUT at the node 46 is held at the voltage it developed during the previous sampling mode operation.

The transistor Q12 is turned on such that the bias current IBIAS from the source IS3 flows through the transistor Q12, diodes D11 and D12 and transistor Q26 to the source VEE. The transistor Q26 acts as a buffer between the output node 46 and the transistors Q5 and Q8, whereas the diodes D11 and D12 provide sufficient voltage shift to ensure that the transistors Q5 are Q8 are reverse biased and thereby turned off.

Similarly, the transistor Q10 is turned on such that the bias current IBIAS from the source IS2 flows through the transistor Q10, diodes D9 and D10 and transistor Q25 to the source VCC. The transistor Q25 acts as a buffer between the output node 46 and the transistors Q6 and Q7, whereas the diodes D9 and D10 provide sufficient voltage shift to ensure that the transistors Q6 are Q7 are reverse biased and thereby turned off.

The transistors Q14 and Q16 are turned on to connect the I3 and I4 outputs of the current mirrors 42 and 44 to ground to ensure that the capacitor C3 is completely isolated.

Figure 1:
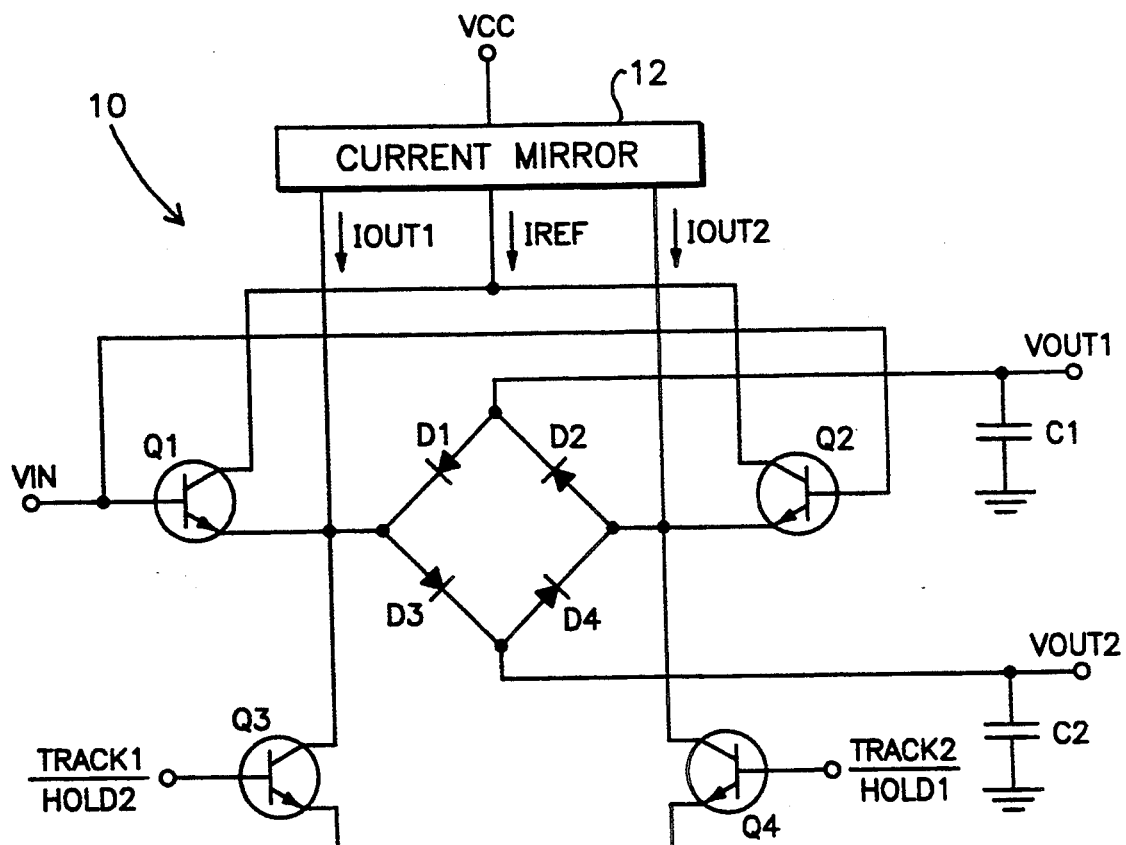
FIG. 1 is an electrical schematic diagram illustrating a prior art sample-and-hold circuit.

In sampling mode, the capacitor C3 is charged or discharged by both the primary push-pull currents I1 and I2 flowing through the resistor R1, as well as the secondary push-pull currents I3 and I4 flowing through the outputs thereof respectively. This increases the slew current of the present sample-and-hold circuit 40 by a factor of two over that of the prior art circuit 10 as illustrated in FIG. 1 in which the capacitors C1 and C2 are charged or discharged by only the output currents of the current mirror 12.

In addition, the present current mirrors 42 and 44 are independent of the bias current sources IS2 and IS3, and for this reason the primary and secondary push-pull currents are not limited to IBIAS as in the prior art. The increased slew current results in increased slew rate and acquisition speed during the transition from holding to sampling mode over the prior art.

The present sample-and-hold circuit 40 has higher linearity than the prior art circuit 10 due to the parallel current feed-forward configuration of the current mirrors 42 and 44. In accordance with the present invention, the linearity is yet further improved through the cancellation of non-linear signal modulation generated in the circuit 40.

The effective width of the base region in a bipolar transistor varies as a non-linear function of the collector-emitter voltage Vce. This causes modulation of the current gain $\beta$ of the transistor which in turn causes a change in the base and collector currents of the transistor even though the emitter current remains constant. This is known as "base-width", or "Early effect" modulation.

Base width modulation is generated in the output transistors Q7 and Q8 and, without the improvement of the invention, would cause corresponding non-linear modulation and distortion of the output voltage VOUT.

To cancel this modulation, the switching transistors Q13 and Q15 are of opposite conductivity type (NPN vs PNP), and are connected in circuit such that the non-linear modulation of the secondary push-pull currents I3 and I4 by the transistors Q13 and Q15 is out-of-phase with and cancels the non-linear modulation of the primary push-pull currents I1 and I2 by the transistors Q7 and Q8.

In order to achieve cancellation of non-linear current modulation, the transistors Q7 and Q15 and the transistors Q8 and Q13 have the same conductivity type and are closely matched such that they have substantially identical non-linear modulation characteristics. Assuming that the signal VIN increases, the emitter-collector voltage Vce of the transistor Q7 decreases and the base current Ib thereof increases by a value $\Delta Ib$. However, since VOUT follows VIN, the Vce of the transistor Q15 will increase by the same amount that the Vce of the transistor Q7 decreases, and the base current Ib of the transistor Q15 will decrease by $\Delta Ib$.

The primary push-pull current I1 which flows into the node 46 is decreased by $\Delta Ib$, whereas the secondary push-pull current I4 which also flows into the node 46 is increased by $\Delta Ib$. The net change of current flow into the node 46 and thereby into the capacitor C3 is thereby zero, and the non-linear current modulation is canceled.

The operation is opposite for a decrease in the signal VIN. The transistors Q8 and Q13 are both of PNP conductivity type, and operate in an essentially similar manner as the transistors Q7 and Q15.

A significant amount of time is required to turn on the current mirrors 42 and 44 after they have been turned off. For this reason, a trickle resistor RT is connected between the collectors of the transistors Q7 and Q8 to cause a small trickle current to constantly flow through the current mirrors 42 and 44. The trickle current prevents the current mirrors 42 and 44 from turning off completely, and thereby increases their response speed when switching between holding and samping modes.

The same function can be provided by replacing the single trickle resistor RT with a trickle resistor RT1 which is connected between the collector of the transistor Q7 and the source VEE, and a trickle resistor RT2 which is connected between the collector of the transistor Q8 and the source VCC respectively.

Figure 4:
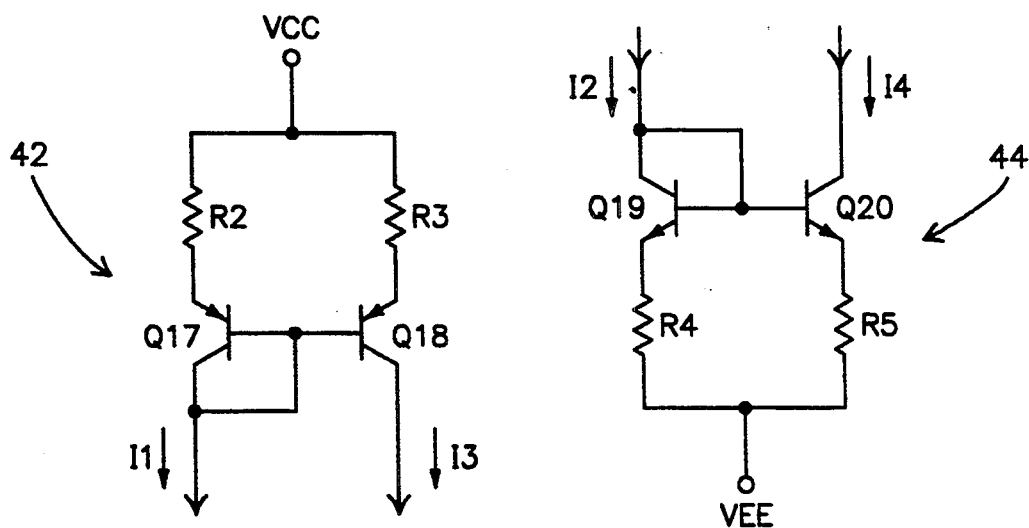
FIG. 4 illustrates a current mirror of the sample-and-hold circuit of FIG. 3.

The current mirrors 42 and 44 can have any suitable configuration within the scope of the invention, such as conventional Wilson current mirrors such as illustrated in FIG. 4. The current mirror 42 includes matched PNP transistors Q17 and Q18 which have their bases connected together. The emitters of the transistors Q17 and Q18 are connected through resistors R2 and R3 to the source VCC respectively.

The base and collector of the transistor Q17 are interconnected, and the currents I1 and I3 flow through the collectors of the transistors Q17 and Q18 respectively. In the preferred embodiment of the invention, the resistors R2 and R3 have the same value, or are omitted. This causes the transistors Q17 and Q18 to operate with the same base-emitter voltage Vbe and thereby the same collector current.

In the case of unity current gain, the currents I1 and I3 are substantially equal and the currents I2 and I4 are also equal. Equal and opposite currents flow through the transistor pairs Q7, Q15 and Q8, Q13 of the amplifier 40, providing maximum cancellation of non-linear modulation and signal linearity.

Although unity current gain provides maximum linearity, it is within the scope of the invention to provide current gain larger or smaller than unity in applications in which the non-unity current gain is more important than the corresponding decrease in linearity. This can be accomplished by making the values of the resistors R2 and R3 unequal, and/or alternatively by appropriately scaling the areas of the emitters of the transistors Q17 and Q18.

The current mirror 44 includes NPN transistors Q19 and Q20 and resistors R4 and R5, and operates in essentially the same manner as the current mirror 42.

As described above, non-linear current modulation created by the output transistors Q7 and Q8 of the amplifier 20 is canceled by the switching transistors Q13 and Q15. However, the transistors Q5 and Q6 create similar non-linear base width and accompanying signal current modulation.

Figure 5:
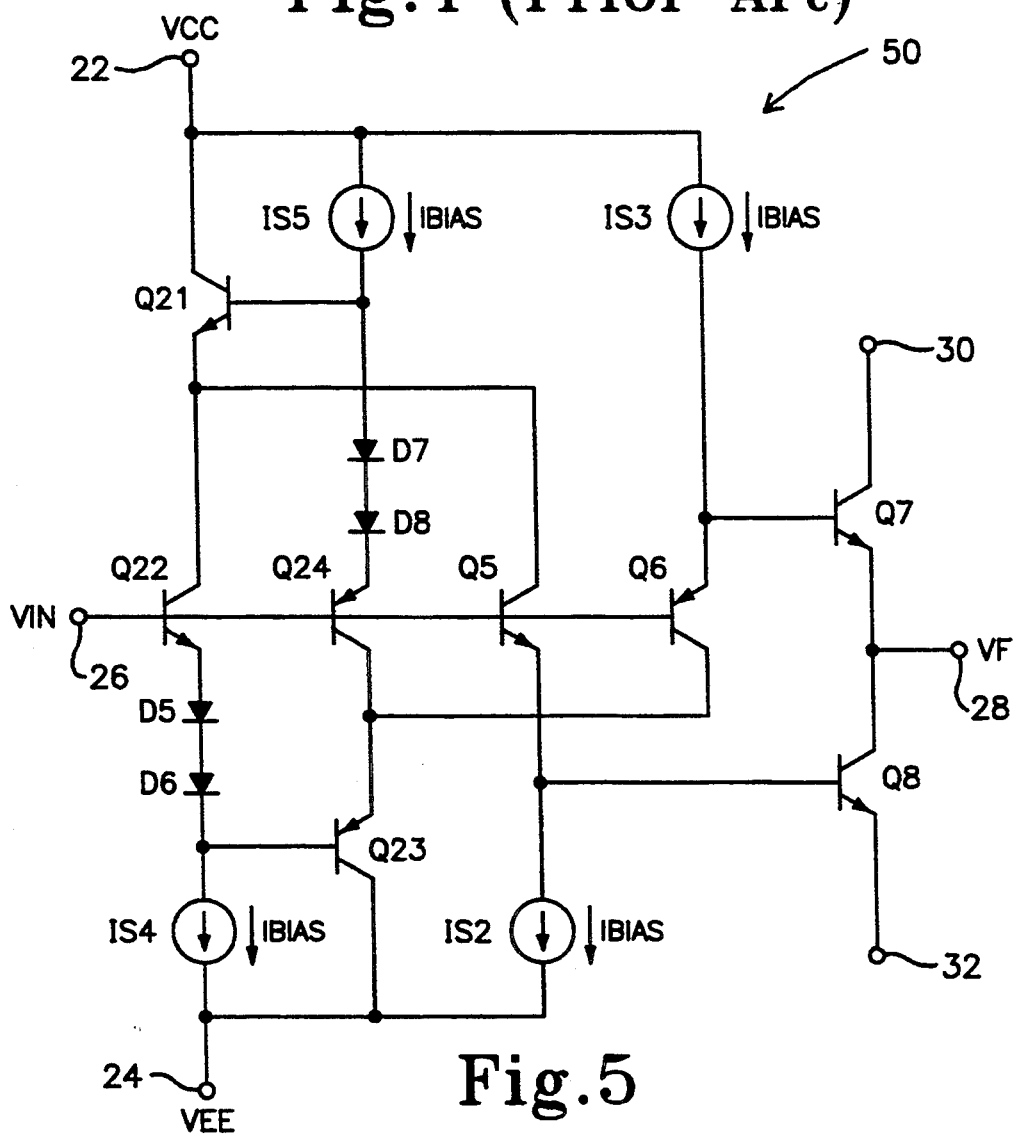
FIG. 5 illustrates additional circuitry which can be added to the front end of the transconductance amplifier of FIG. 2 to increase the linearity thereof.

The present sample-and-hold circuit 40 can be made yet more linear by adding circuitry to prevent non-linear modulation of the transistors Q5 and Q6 as illustrated in FIG. 5. For ease of comparison, the elements common to those of the amplifier 20 illustrated in FIG. 2 are designated by the same reference numerals, and the transistor switches are omitted.

In addition to the elements of the amplifier 20, a bootstrapped amplifier 50 includes an NPN transistor Q21 having a collector connected to the terminal 22 and an emitter connected to the collector of an NPN transistor Q22. The emitter of the transistor Q22 is connected to the terminal 24 through diodes D5 and D6 and a constant bias current source IS4 which sinks a constant current IB4.

A PNP transistor Q23 has a collector connected to the terminal 24 and an emitter connected to the collector of a PNP transistor Q24. The emitter of the transistor Q24 is connected to the terminal 22 through diodes D7 and D8 and a constant bias current source IS5 which sources a constant current IB5.

The input signal VIN is applied to the bases of the transistors Q22 and Q24. The base of the transistor Q21 is connected to the junction of the diode D7 and the source IS5. The base of the transistor Q23 is connected to the junction of the diode D6 and the source IS4. The collector of the transistor Q5 is connected to the emitter of the transistor Q21, whereas the collector of the transistor Q6 is connected to the emitter of the transistor Q23.

The base voltage of the transistor Q21 follows the input voltage VIN, but is three diode drops Vbe above VIN. This is due to one Vbe drop across the base-emitter junction of the transistor Q24 and one Vbe drop across each of the diodes D7 and D8. The emitter voltage of the transistor Q21 and thereby the collector voltages of the transistors Q22 and Q5 are two Vbe drops above VIN due to the Vbe drop across the base-emitter junction of the transistor Q21.

The collectors of the transistors Q22 and Q5 are maintained at a constant voltage offset of +2 Vbe from the bases and thereby the emitters thereof. In this manner, the collector-emitter voltages Vce of the transistors Q22 and Q5 do not change, and no base width modulation is produced. In an essentially similar manner, the collectors of the transistors Q24 and Q6 are maintained two diode drops or −2 Vbe below VIN.

While an illustrative embodiment of the invention has been shown and described, numerous variations and alternate embodiments will occur to those skilled in the art, without departing from the spirit and scope of the invention.

For example, although the sample-and-hold circuit of the present invention has been described and illustrated as being embodied using bipolar transistors, it may alternatively be embodied by field-effect or other types of transistors which provide the required functions.

Accordingly, it is intended that the present invention not be limited solely to the specifically described illustrative embodiment. Various modifications are contemplated and can be made without departing from the spirit and scope of the invention as defined by the appended claims.

We claim:

1. A sample-and-hold circuit, comprising:
   push-pull transconductance amplifier means for generating primary push-pull currents corresponding to an applied input signal;
   current mirror means for generating secondary push-pull currents corresponding to said primary push-pull currents;
   capacitor means for charging by said primary and secondary push-pull currents to produce an output signal; and
   switch means for enabling the amplifier means to apply said primary push-pull currents to the capacitor means and enabling the current mirror means to apply said secondary push-pull currents to the capacitor means throughout a sampling period; and for preventing the amplifier means from applying said primary push-pull currents to the capacitor means and preventing the current mirror means from applying said secondary push-pull currents to the capacitor means throughout a holding period.

2. A circuit as in claim 1, in which the current mirror means has a current gain of substantially unity.

3. A circuit as in claim 1, in which the switch means connects the current mirror means to the capacitor means for sampling; and disconnects the current mirror means from the capacitor means for holding.

4. A circuit as in claim 1, in which the switch means activates the amplifier means to generate and apply said primary push-pull currents to the current mirror means for sampling; and de-activates the amplifier means such that it will not generate and apply said primary push-pull currents to the current mirror means for holding.

5. A sample-and-hold circuit comprising:
   transconductance amplifier means including a pair of push-pull output transistors for producing primary push-pull currents corresponding to an applied input signal;
   current mirror means for producing secondary push-pull currents corresponding to said primary push-pull currents;
   capacitor means for charging by said primary and secondary push-pull currents to produce an output signal; and
   switch means for enabling the amplifier means to apply said primary push-pull currents to the capacitor means and enabling the current mirror means to apply said secondary push-pull currents to the capacitor means throughout a sampling period; and for preventing the amplifier means from applying said primary push-pull currents to the capacitor means and preventing the current mirror means from applying said secondary push-pull currents to the capacitor means throughout a holding period;
   wherein the switch means having a pair of switching transistors connected in circuit such that said secondary push-pull currents flow therethrough; and
   the output transistors and the switching transistors have substantially identical non-linear modulation characteristics and are connected in circuit such that non-linear modulation of said primary push-pull currents by the output transistors is substantially canceled by non-linear modulation of said secondary push-pull currents by the switching transistors.

6. A circuit as in claim 5, in which:
   the output transistors have opposite conductivity type;
   the switching transistors have opposite conductivity type; and
   the output transistors and the switching transistors are connected in circuit such that an increase in primary push-pull current flow through one of the output transistors causes a decrease in secondary push-pull current flow through a respective one of the switching transistors which has the same conductivity type as said one of the switching transistors, and vice-versa.

7. A circuit as in claim 5, in which the current mirror means has a current gain of substantially unity.

8. A circuit as in claim 5, in which the current mirror means comprises a pair of current mirrors connected between the output transistors and the switching transistors respectively.

9. A sample-and-hold circuit comprising:
push-pull transconductance amplifier means for generating primary push-pull currents corresponding to an applied input signal;
current mirror means for generating secondary push-pull currents corresponding to said primary push-pull currents;
trickle current means for causing a predetermined trickle current to constantly flow through the current mirror means; and
switch means for enabling the amplifier means to apply said primary push-pull currents to the capacitor means and enabling the current mirror means to apply said secondary push-pull currents to the capacitor means throughout a sampling period; and for preventing the amplifier means from applying said primary push-pull currents to the capacitor means and preventing the current mirror means from applying said secondary push-pull currents to the capacitor means throughout a holding period.

10. A sample-and-hold circuit comprising:
push-pull transconductance transistor amplifier means for generating primary push-pull currents corresponding to an applied input signal;
current mirror means for generating secondary push-pull currents corresponding to said primary push-pull currents;
capacitor means for charging by said primary and secondary push-pull currents to produce an output signal; and
switch means for turning on the transistor amplifier means to generate and apply said primary push-pull currents to the capacitor means and to the current mirror means and enabling the current mirror means to apply said secondary push-pull currents to the capacitor means throughout a sampling period; and for turning off the transistor amplifier means to prevent application of said primary push-pull currents to the capacitor means and to the current mirror means and preventing the current mirror means from applying said secondary push-pull currents to the capacitor means throughout a holding period.

11. A circuit as in claim 1, in which the amplifier means comprises:
high impedance input terminal means for receiving said input signal; and
low impedance output terminal means for producing said primary push-pull currents.

12. A circuit as in claim 11, further comprising resistance means connected in circuit between the output terminal means and the capacitor means.

13. A circuit as in claim 12, further comprising high impedance output node means, in which:
the capacitor means is connected across the output node means;
the amplifier means applies said primary push-pull currents through the output terminal means and the resistance means to the output node means; and
the current mirror means applies said secondary push-pull currents to the output node means.

14. A sample-and-hold circuit, comprising:
amplifier means for generating a primary current corresponding to an applied input signal;
current mirror means for generating a secondary current corresponding to said primary current;
capacitor means connected in circuit for charging by said primary and secondary currents to produce an output signal; and
switch means for enabling the amplifier means to apply said primary current to the capacitor means and enabling the current mirror means to apply said secondary current to the capacitor means throughout a sampling period; and for preventing the amplifier means from applying said primary current to the capacitor means and preventing the current mirror means from applying said secondary current to the capacitor means throughout a holding period.

15. A circuit as in claim 14, in which the current mirror means has a current gain of substantially unity.

16. A circuit as in claim 14, in which the switch means connects the current mirror means to the capacitor means for sampling; and disconnects the current mirror means from the capacitor means for holding.

17. A circuit as in claim 14, in which the switch means activates the amplifier means to generate and apply said primary current to the current mirror means for sampling; and de-activates the amplifier means such that it will not generate and apply said primary current to the current mirror means for holding.

18. A circuit as in claim 14, in which the amplifier means comprises:
high impedance input terminal means for receiving said input signal; and
low impedance output terminal means for producing said primary current.

19. A circuit as in claim 18, further comprising resistance means connected in circuit between the output terminal means and the capacitor means.

20. A circuit as in claim 19, further comprising high impedance output node means, in which:
the capacitor means is connected across the output node means;
the amplifier means applies said primary current through the output terminal means and the resistance means to the output node means; and
the current mirror means applies said secondary current to the output node means.

21. A sample-and-hold circuit comprising:
amplifier means for generating a primary current corresponding to an applied input signal;
current mirror means for generating a secondary current corresponding to said primary current;
trickle current means for causing a predetermined trickle current to constantly flow through the current mirror means;
capacitor means connected in circuit for charging by said primary and secondary currents to produce an output signal; and
switch means for enabling the amplifier means to apply said primary current to the capacitor means and enabling the current mirror means to apply said secondary current to the capacitor means throughout a sampling period; and for preventing the amplifier means from applying said primary current to the capacitor means and preventing the current mirror means from applying said secondary current to the capacitor means throughout a holding period.

22. A sample-and-hold circuit comprising:
transistor amplifier means for generating a primary current corresponding to an applied input signal;
current mirror means for generating a secondary current corresponding to said primary current;
capacitor means connected in circuit for charging by said primary and secondary currents to produce an output signal; and switch means for turning on the transistor amplifier means to apply said primary current to the capacitor means and enabling the current mirror means to apply said secondary current to the capacitor means throughout a sampling period; and for turning off the transistor amplifier means to prevent application of said primary current to the capacitor means and preventing the current mirror means from applying said secondary current to the capacitor means throughout a holding period.

* * * * *